United States Patent
Yang et al.

(10) Patent No.: US 10,297,676 B2
(45) Date of Patent: May 21, 2019

(54) PARTIALLY BIASED ISOLATION IN SEMICONDUCTOR DEVICE

(71) Applicant: NXP USA, Inc., Austin, TX (US)

(72) Inventors: Hongning Yang, Chandler, AZ (US); Xin Lin, Phoenix, AZ (US); Ronghua Zhu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/362,962

(22) Filed: Nov. 29, 2016

(65) Prior Publication Data

US 2017/0077296 A1 Mar. 16, 2017

Related U.S. Application Data

(63) Continuation-in-part of application No. 14/851,360, filed on Sep. 11, 2015.

(51) Int. Cl.
| | |
|---|---|
| *H01L 29/06* | (2006.01) |
| *H01L 29/10* | (2006.01) |
| *H01L 29/66* | (2006.01) |
| *H01L 29/78* | (2006.01) |
| *H01L 27/105* | (2006.01) |

(Continued)

(52) U.S. Cl.
CPC ........ *H01L 29/66659* (2013.01); *H01L 21/76* (2013.01); *H01L 21/761* (2013.01); *H01L 21/76224* (2013.01); *H01L 29/063* (2013.01); *H01L 29/0653* (2013.01); *H01L 29/1087* (2013.01); *H01L 29/7835* (2013.01); *H01L 29/1045* (2013.01); *H01L 29/1083* (2013.01); *H01L 29/402* (2013.01)

(58) Field of Classification Search
CPC . H01L 29/402; H01L 29/42725; H01L 29/78; H01L 29/7823; H01L 29/7835; H01L 29/0634; H01L 29/0696; H01L 29/086; H01L 29/0878; H01L 21/26513; H01L 21/26506; H01L 21/2652; H01L 21/266; H01L 29/7816–29/7826; H01L 29/66681–29/66704; H01L 29/1095; H01L 29/0653; H01L 29/1045
USPC ............... 257/328, 339, 343, 336, 335, 655, 257/E29.256; 438/286
See application file for complete search history.

(56) References Cited

U.S. PATENT DOCUMENTS 4,300,150 A * 11/1981 Colak ................. H01L 29/0619
257/336
6,753,575 B2 * 6/2004 Efland ................... H01L 21/761
257/335

(Continued)

*Primary Examiner* — Natalia A Gondarenko

(57) ABSTRACT

Embodiments of a device are provided, including a semiconductor substrate including an active device area; a body region disposed in the semiconductor substrate within the active device area, wherein a channel is formed within the body region during operation; a doped isolation layer disposed in the semiconductor substrate underneath the active device area, the doped isolation layer including an opening positioned under the active device area; and a lightly-doped isolation layer disposed in the semiconductor substrate underneath the active device area, the lightly-doped isolation layer positioned at least within the opening and in electrical contact with the doped isolation layer, wherein the doped isolation layer and the lightly-doped isolation layer form a doped isolation barrier that extends across an entire lateral extent of the active device area.

19 Claims, 6 Drawing Sheets

(51) Int. Cl.
*H01L 21/76* (2006.01)
*H01L 21/761* (2006.01)
*H01L 21/762* (2006.01)
*H01L 29/40* (2006.01)

(56) References Cited

U.S. PATENT DOCUMENTS

| | | | |
|---|---|---|---|
| 6,882,023 B2 | 4/2005 | Khemka et al. | |
| 8,541,862 B2 | 9/2013 | Yang et al. | |
| 9,306,060 B1 | 4/2016 | Yang et al. | |
| 2005/0082603 A1* | 4/2005 | Fujii | H01L 29/1083 257/328 |
| 2008/0182394 A1* | 7/2008 | Yang | H01L 29/402 438/510 |
| 2011/0115020 A1* | 5/2011 | Cha | H01L 29/0878 257/343 |
| 2013/0134511 A1* | 5/2013 | Yang | H01L 21/761 257/339 |
| 2013/0187226 A1* | 7/2013 | Park | H01L 29/402 257/343 |
| 2013/0270606 A1 | 10/2013 | Chen et al. | |
| 2013/0270636 A1* | 10/2013 | Ito | H01L 29/7835 257/336 |
| 2014/0070315 A1* | 3/2014 | Levy | H01L 29/0634 257/343 |
| 2015/0069509 A1* | 3/2015 | Lee | H01L 29/7816 257/343 |
| 2015/0236087 A1* | 8/2015 | Chang | H01L 29/0619 257/339 |
| 2016/0043217 A1 | 2/2016 | Cai | |
| 2016/0181421 A1 | 6/2016 | Yang et al. | |

* cited by examiner

PARTIALLY BIASED ISOLATION IN SEMICONDUCTOR DEVICE

CROSS-REFERENCE TO RELATED APPLICATIONS

This application is a continuation-in-part of U.S. patent application Ser. No. 14/851,360, having a filing date of Sep. 11, 2015, a common inventor, and a common assignee, all of which is incorporated by reference in its entirety.

BACKGROUND

Field

This disclosure relates generally to semiconductor devices, and more specifically, to laterally diffused metal-oxide-semiconductor field effect transistors.

Related Art

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete the both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
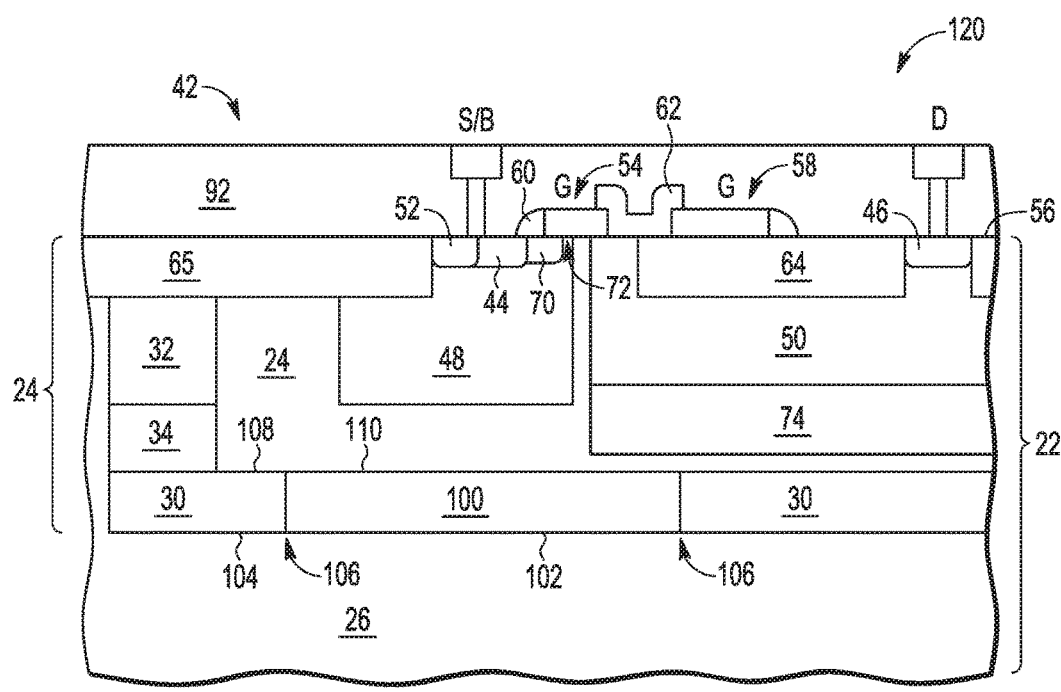
FIG. 1-5 illustrate block diagrams depicting cross-sectional views of example n-channel LDMOS (or NLDMOS) devices in which the present disclosure is implemented, according to some embodiments.

The following sets forth a detailed description of various embodiments intended to be illustrative of the invention and should not be taken to be limiting.

Overview

Embodiments of laterally diffused metal oxide semiconductor (LDMOS) and other power transistor devices and electronic apparatus with partially biased isolation regions, core-isolated body regions, or both are described. Isolation regions may be partially lifted to a bias voltage level using a well region that couples the isolation regions to an isolation contact region. The well region is positioned and otherwise configured to be depleted of charge carriers, also referred to a depleted well region. As a result, some of the bias voltage applied to the isolation contact region is sustained across the depleted well region. Only a portion of the bias voltage is therefore passed on to the isolation regions. The depleted well region thus provides partial biasing, or lifting of the isolation potential.

The partial lifting of the isolation potential avoids biasing the isolation regions at voltage levels that would otherwise establish the breakdown voltage level of the device. With significantly less voltage stress between the device body and the isolation regions, greater breakdown voltage levels (e.g., BVdss levels) may be achieved. For high voltage switching applications, the breakdown voltage of a fully isolated field drift LDMOS device is required to be at least 15 Volts (V) to 20V higher than the high-side operation voltage. Partial lifting achieves a breakdown voltage up to, for instance, 100V for a high-side operation voltage of, for instance, 100V.

In order to further reduce voltage stress, the present disclosure provides a configuration of isolation regions to form a lateral isolation barrier utilized in the isolated LDMOS, which further achieves breakdown voltages up to, for instance, 150V or 200V or beyond for a high-side operation voltage of, for instance, 100V or 150V or beyond. The lateral isolation barrier underlies a core device area of the LDMOS that includes the device body. The lateral isolation barrier includes a doped buried layer having an opening that is disposed underneath the device body, and a lightly-doped buried layer having a lower dopant concentration than the doped buried layer that is disposed at least within the opening and in electrical contact with the doped buried layer. In some embodiments, the lightly-doped buried layer is disposed across the entire active device area. The doped buried layer and the lightly-doped buried layer are not fully depleted under the electric field when the lateral isolation barrier is partially lifted. However, the lightly-doped buried layer's lower dopant concentration improves the vertical breakdown voltage (e.g., extends the vertical stress capability) between the device body and the lateral isolation barrier (e.g., when the drain voltage is biased).

The depleted well region is incorporated into a periphery of the device, rather than in the core device area. The peripheral location may be useful because, for large power devices, the size of the peripheral areas of the devices is relatively negligible. As a result, the overall increase in device size is negligible. Performance parameters related to device size, such as resistance, are thus not significantly affected.

Another depleted well region may be used to partially bias isolation regions adjacent a deep trench isolation (DTI) region. Additional breakdown protection for the DTI region may thus be provided. In some cases, the depleted well regions are disposed in a laterally symmetrical arrangement about the isolation contact region, in which case the same amount of bias voltage is sustained. In other cases, the depleted well region protecting the DTI region may be larger (e.g., wider) such that even less voltage stress is placed on the DTI region.

The depleted well region may be formed in both n-channel and p-channel devices. The method embodiments may form the depleted well region using an implant directed to forming a drift region (e.g., n-channel devices with a p-type body) or a body region (e.g., p-channel devices with a p-type body). Other regions may also be formed using available implants. For instance, a buried well region used to deplete the depleted well region may be configured to form a RESURF region used to deplete a drift region of an n-channel LDMOS device. Increases in fabrication costs may thus be avoided.

In some embodiments, one or more aspects of the device in the core device area are configured to support the partial biasing of the isolation regions. For instance, in devices in which the device body and the isolation regions have the same conductivity type (e.g., p-channel devices with an n-type body), the device body may be electrically isolated from the isolation regions within the core device area. The device body may be surrounded by a number of oppositely doped, buried wells. One or more of the buried wells may be formed using an implant directed to forming other device regions, such as the implant that forms the buried well regions used to deplete both the depleted well region for partial isolation biasing and the drift region of, e.g., an n-channel LDMOS device with a p-type body.

Example Embodiments

Figure 4:
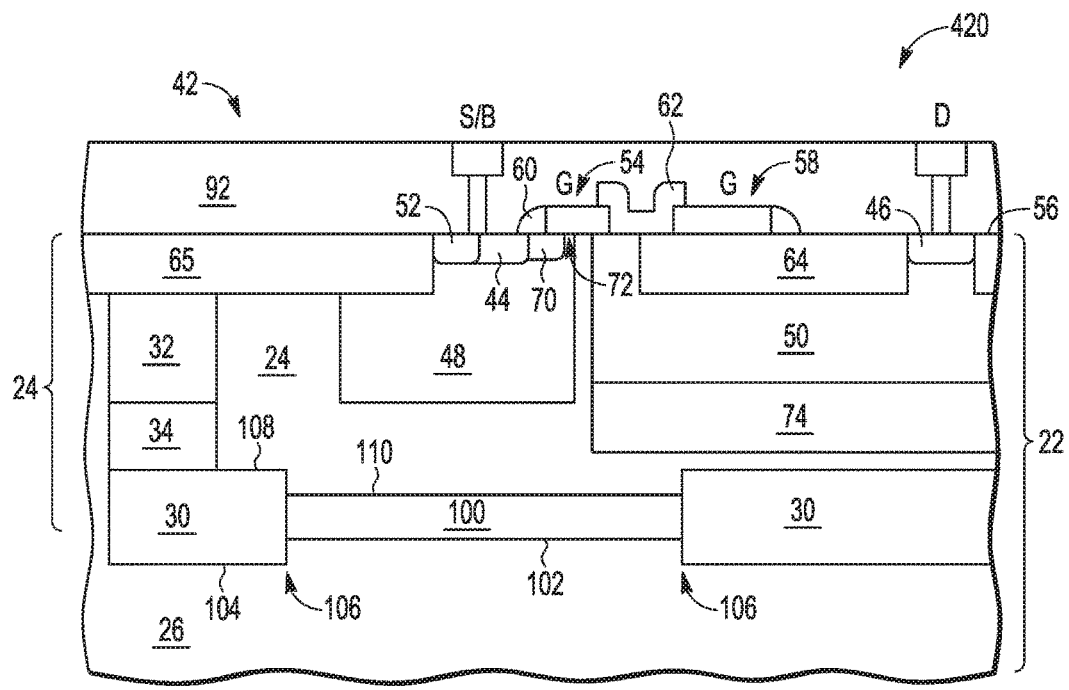
Figure 5:
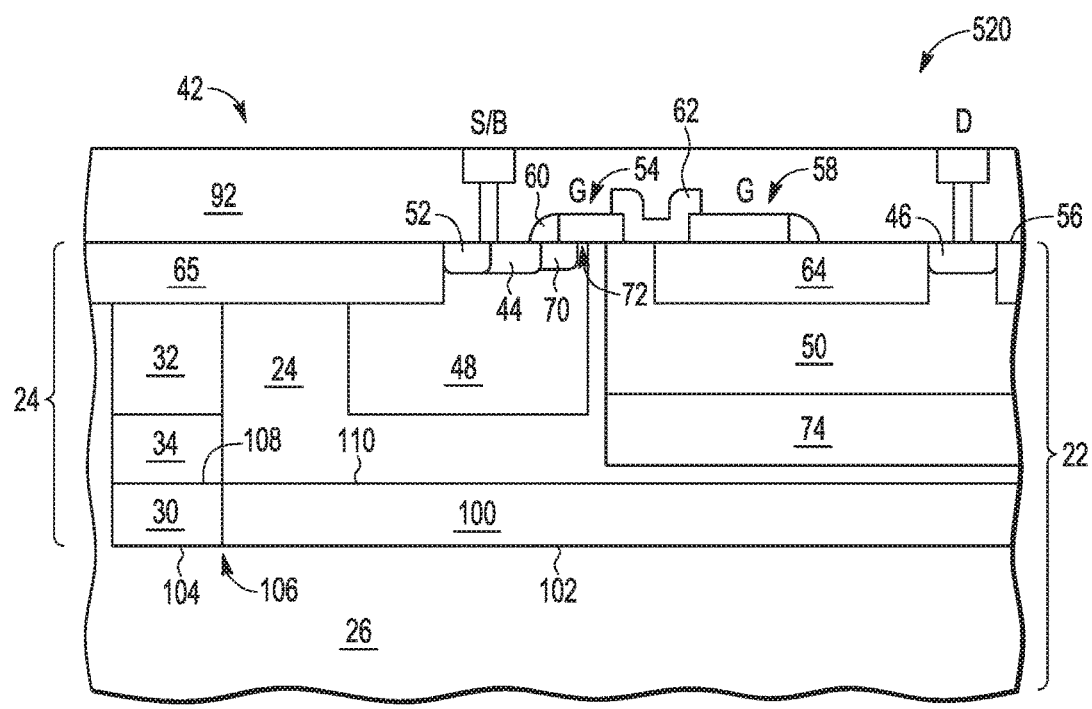
Figure 6:
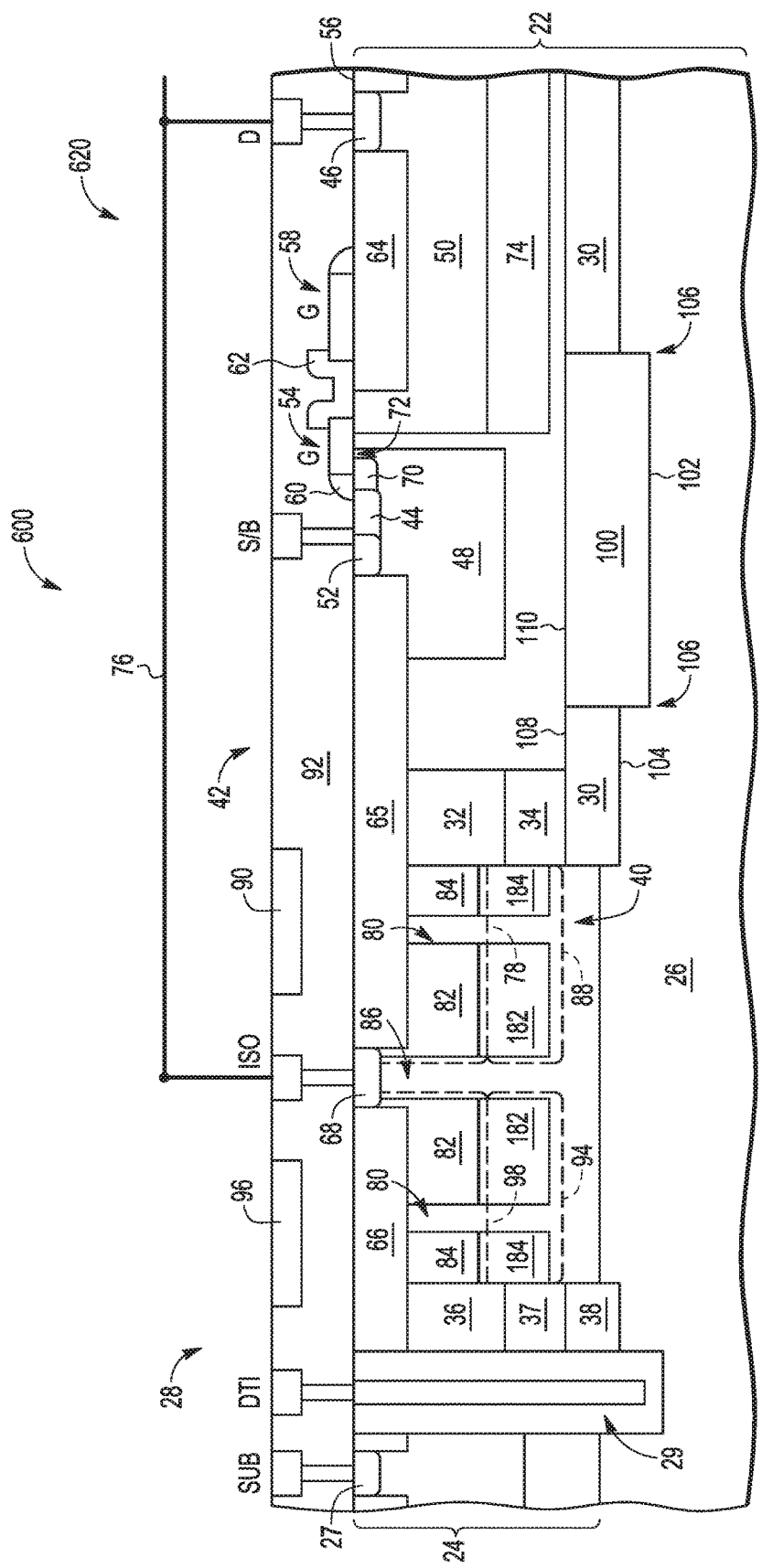
FIG. 6 illustrates a block diagram depicting a cross-sectional view of an example semiconductor device that includes an NLDMOS device of the present disclosure, according to some embodiments.
Figure 7:
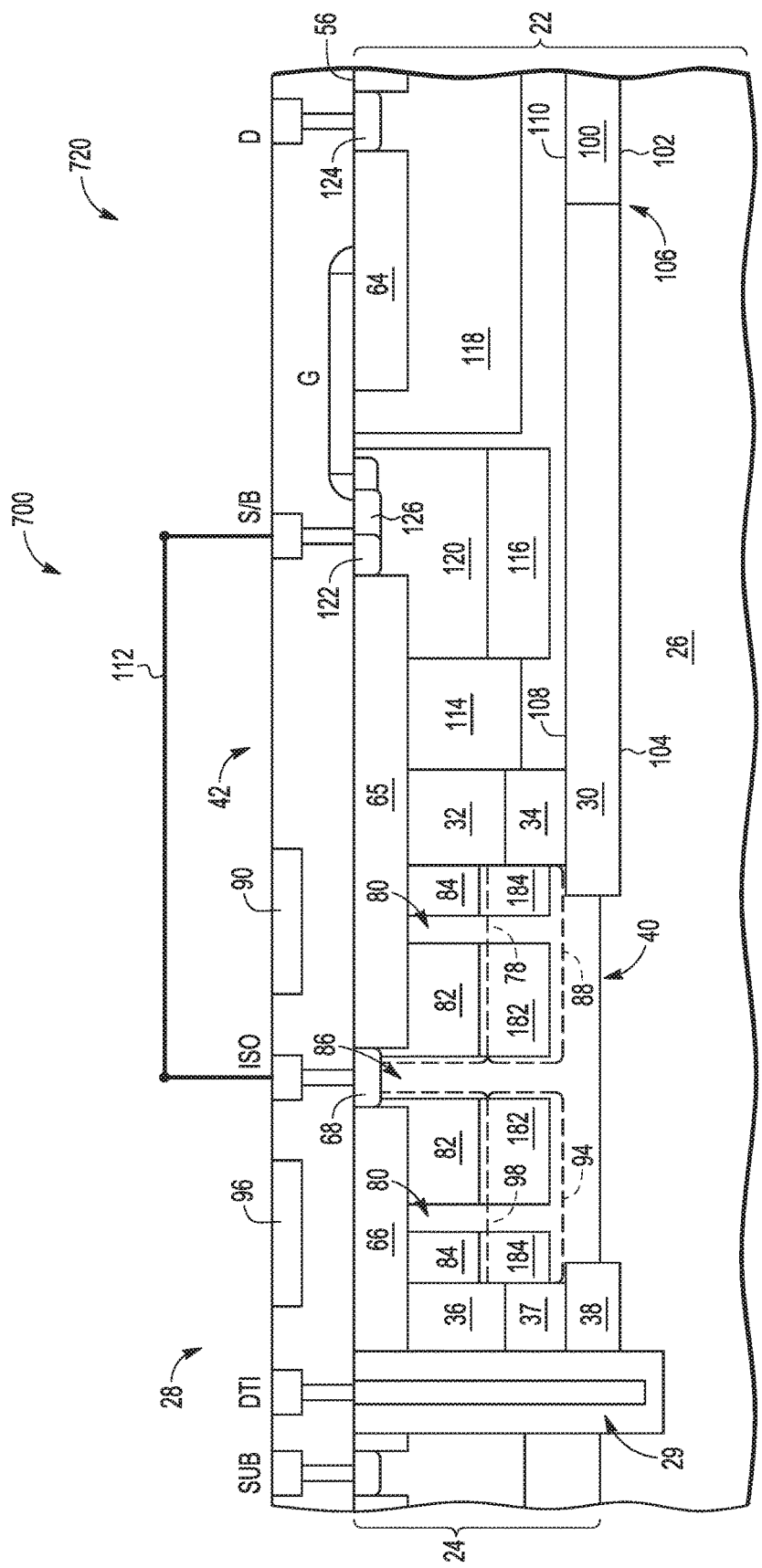
FIG. 7 illustrates a block diagram depicting a cross-sectional view of an example semiconductor device that includes a p-channel LDMOS (or PLDMOS) device of the present disclosure, according to some embodiments.

FIG. 1-7 illustrate schematic cross-sectional views of example semiconductor devices that include LDMOS devices. Each illustrated LDMOS device may also be configured as a RESURF transistor, such as a double RESURF arrangement. A core device area (or active device area) 42 of an LDMOS device is shown in FIG. 1-5, which may correspond with the area in which the active components of the LDMOS device are disposed. An overall device area 28 of a semiconductor device that includes an LDMOS device is shown in FIG. 6-7, which may correspond with the area in which active components of the semiconductor device (including the LDMOS device) are disposed. FIG. 1-6 illustrate example n-channel LDMOS devices (or NLDMOS devices), and FIG. 7 illustrates an example p-channel LDMOS device (or a PLDMOS device).

It is noted that FIG. 1-7 illustrate semiconductor devices in simplified form in the sense that only one side or half of a core device area 42 (or overall device area 28) is shown. For example, the core device area 42 of FIG. 1 may be laterally symmetrical about, e.g., a drain region (such as drain region 46), and, thus include a portion that mirrors the portion shown. The drain region 46 may thus be disposed in the center (or along a central line) of the semiconductor device 120. The other side may thus include a second source region 44 separated from the drain region 46 by a second gate structure 54. In some embodiments, the second source region 44 and the second gate structure 54 are contiguously formed with the corresponding regions of the semiconductor device described below via one or more connecting structures offset from the lateral cross-sections of FIG. 1-7. For example, the gate structure 54 may be U-shaped or arch-shaped (e.g., a single lateral connection) or toroidal or looped (e.g., two lateral connections) when viewed from above. The shapes of the above-described regions of the semiconductor devices may vary considerably from these examples.

The semiconductor devices shown in FIG. 1-7 are implemented in a semiconductor substrate 22, which may in turn include a number of epitaxial layers 24 grown on an original bulk substrate 26. Semiconductor substrate 22 may include any semiconductor material or combinations of materials, such as gallium arsenide, silicon germanium, silicon-on-insulator (SOI), silicon, monocrystalline silicon, the like, and combinations of the above. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

FIG. 1 illustrates an example NLDMOS device 120 implemented in semiconductor substrate 22, which may, in turn, include a number of epitaxial layers 24. In the embodiment shown in FIG. 1, the semiconductor substrate 22 includes a single p-type epitaxial layer 24 grown on an original bulk substrate 26. The original substrate 26 may be a lightly-doped p-type substrate in some embodiments, or may be a heavily doped p-type substrate in other embodiments, such as those having multiple epitaxial layers. NLDMOS device 120 may alternatively or additionally include non-epitaxial layers in which one or more device regions are formed. The discussion of the device regions shown in FIG. 1 is also applicable to the device regions having same reference numerals in FIG. 2-7.

The core device area 42 of the NLDMOS device 120 is defined by a doped isolation barrier, which is provided to isolate the NLDMOS device 120 from the surrounding substrate 22. The doped isolation barrier may be disposed along the periphery of the core device area 42 and underneath the core device area 42. The layers and regions of the doped isolation barrier may laterally, vertically, or both laterally and vertically surround the core device area 42 for isolation of the NLDMOS device 120. For example, the regions or layers of the doped isolation barrier may form an isolation tub in which the active components of the NLDMOS device 120 are disposed, where the isolation tub includes a bottom and sidewalls extending upward from the bottom.

In the embodiment shown, a bottom of the isolation tub is defined by a lateral isolation barrier that extends across the entire lateral extent of the core device area 42. The lateral isolation barrier includes a first buried isolation layer 30 and a second buried isolation layer 100. The second buried isolation layer 100 has a lighter dopant concentration level than the first buried isolation layer 30. As such, the first buried isolation layer 30 is also referred to as a doped buried isolation layer 30 and the second buried isolation layer 100 is also referred to as a lightly-doped buried isolation layer 100. The doped buried isolation layer 30 is disposed in the semiconductor substrate 22 under the core device area 42. In the embodiment shown, the doped buried isolation layer 30 surrounds a periphery of the core device area 42 and extends across the entire lateral extent of the core device area 42, with the exception of a window or opening 106 positioned under a body region 48. The lightly-doped buried isolation layer 100 is disposed in the semiconductor substrate 22 at least within the opening 106 and is in contact with the doped buried isolation layer 30 to electrically connect the layers 100 and 30.

Figure 3:
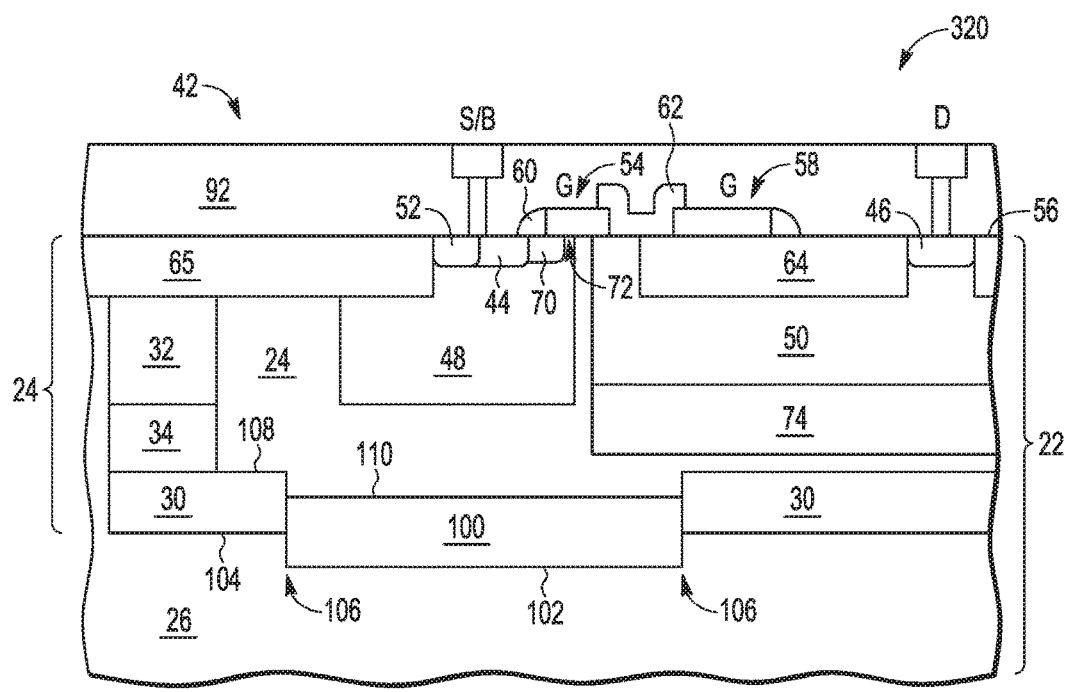

In some embodiments of the lateral isolation barrier, the lateral perimeter of opening 106 is large enough to at least surround a lateral extent of the body region 48 of an NLDMOS device as shown in FIG. 1-6 (or a drain region 124 in a PLDMOS device 720, further discussed below in connection with FIG. 7). In some embodiments, the perimeter of opening 106 may be large enough to also underlie a portion of a drift region 50 and a buried well region 74, as well as a portion of remaining epitaxial layer 24 laterally adjacent to the body region 48 (where such device regions are further discussed below). In other embodiments, the perimeter of opening 106 is large enough to surround an entire lateral extent of the core device area 42 as shown in FIG. 5, leaving the doped buried isolation layer 30 to surround (and be in electrical contact with) a peripheral edge of the core device area 42. In still other embodiments, the lightly-doped buried isolation layer 100 is disposed in the semiconductor substrate 22 across the entire lateral extent of the core device area 42, which is surrounded by (and in electrical contact with) a compound isolation layer at the peripheral edge of the core device area 42, where the compound isolation layer includes both the doped buried isolation layer 30 and the lightly-doped buried isolation layer 100 (e.g., layer 30 of FIG. 1-7 would indicate regions in which both the buried layers 30 and 100 are formed, in such embodiments).

Figure 2:
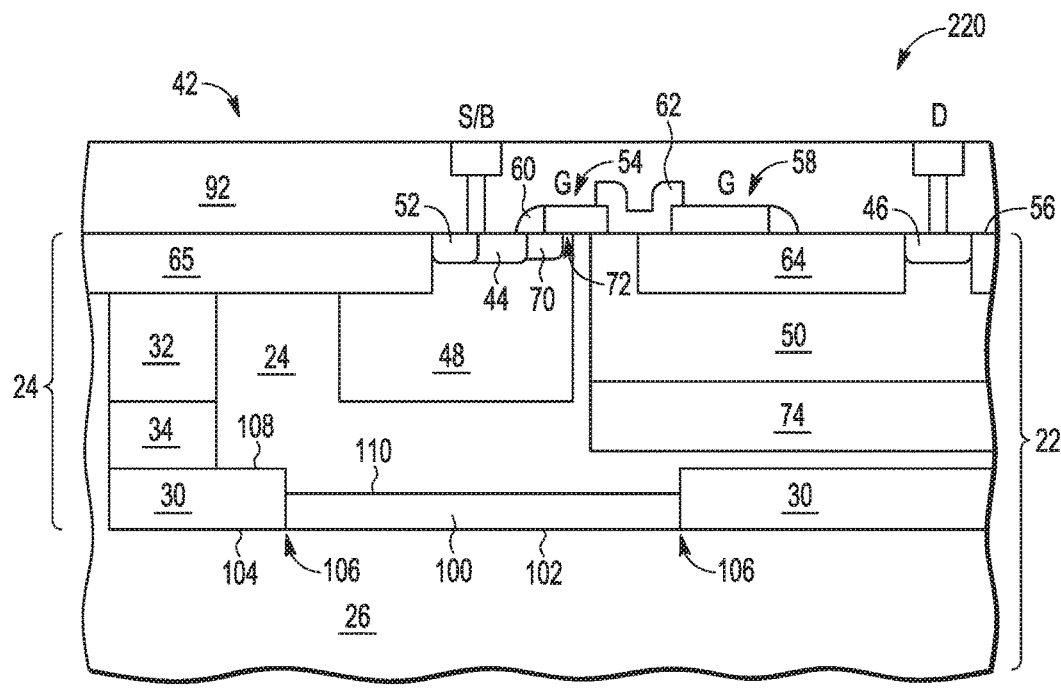

Additionally, an upper surface 110 of the lightly-doped buried isolation layer 100 may be coplanar with or positioned below an upper surface 108 of the doped buried isolation layer 30, and a lower surface 102 of the lightly-doped buried isolation layer 100 may be coplanar with, positioned below, or positioned above a lower surface 104 of the doped buried isolation layer 30. For example, FIG. 1 and FIG. 5 illustrate both upper surface 110 and lower surface 102 of the lightly-doped buried isolation layer 100 being respectively coplanar with upper surface 108 and lower surface 104 of the doped buried isolation layer 30. FIG. 2 illustrates upper surface 110 being positioned below upper surface 108, while lower surface 102 is coplanar with lower surface 104. FIG. 3 illustrates upper surface 110 and lower surface 102 being respectively positioned below upper surface 108 and lower surface 104. FIG. 4 illustrates upper surface 110 being positioned below upper surface 108, and lower surface 102 being positioned above lower surface 104. FIG. 6 illustrates upper surface 110 being coplanar with upper surface 108, and lower surface 102 being positioned below lower surface 104. FIG. 7 illustrates upper surface 110 being coplanar with 108, and lower surface 102 being positioned above lower surface 104.

It is noted that while the embodiments discussed herein are illustrated in relation to only one of an NLDMOS device or a PLDMOS device, such embodiments may be implemented in both an NLDMOS device and a PLDMOS device (e.g., the various embodiments regarding the position of the upper and lower surfaces of layer 100 relative to upper and lower surfaces of layer 30 as shown in FIG. 1-7 are applicable to both NLDMOS and PLDMOS devices).

Returning to FIG. 1, sidewalls of the isolation tub are defined by a vertical isolation barrier that includes isolation wells 32 and 34, with isolation well 32 stacked over and in contact with isolation well 34. The isolation well 34 is also in contact with the doped buried isolation layer 30 to electrically connect the vertical isolation barrier with the lateral isolation barrier. In other cases, a single well, or additional wells, may be used to define the sidewalls. The lateral extent of the core device area 42 is defined in this example by the isolation wells 32, 34. The isolation wells 32, 34 may thus be ring-shaped to laterally surround a peripheral edge of the core device area 42.

In the example shown in FIG. 1, with a p-type substrate, the regions and layers of the lateral and vertical isolation barriers are n-type regions. The n-type doped buried isolation layer 30 and the n-type lightly-doped buried isolation layer 100 may be formed in the semiconductor substrate 22 before the growth of the epitaxial layer 24 thereof. The n-type lateral isolation barrier may thus extend laterally across and under the regions disposed, and later formed, in the core device area 42. The lateral isolation barrier may alternatively or additionally assist in depletion of a drift region of the NDLMOS device 120 to support the RESURF effect, as described below.

One or more of the layers and regions of the doped isolation barrier may have a dopant concentration level and/or be otherwise configured for high voltage (HV) operation (e.g., high side operation in which the terminals of the NDLMOS device 120 are level shifted relative to the semiconductor substrate 22, which may be grounded). For example, the higher dopant concentration level of the isolation barrier layer may be useful in preventing punch-through. The lightly-doped buried isolation layer 100 has a lower dopant concentration level as compared with the doped buried isolation layer 30 in order to further reduce voltage stress, which may be useful to achieve a greater breakdown voltage. Any number of the device isolation wells, sinks, or buried layers may or may not be connected to one another. Additional, fewer, or alternative device isolation layers or regions may be provided in the semiconductor substrate 22.

Within the core device area 42, NLDMOS device 120 includes a source region 44, a drain region 46, a body region 48 in which the source region 44 is disposed, and a drift region 50 in which the drain region 46 is disposed. In this example, the body region 48 is a p-type well formed in the epitaxial layer 24 of the substrate 22. The body region 48 may be biased via one or more heavily doped p-type body contact regions or electrodes 52 formed in or otherwise above the p-type well of the body region 48 in the semiconductor substrate 22. The dopant concentration of each contact region 52 may be at a level sufficient to establish an ohmic contact to the body region 48.

The source and drain regions 44 and 46 are laterally spaced from one another in the lateral dimension shown in the cross-section of FIG. 1. Any number of source or drain regions 44, 46 may be provided. The drain region 46 need not be centered or otherwise disposed between, or laterally surrounded by, the source region 44 as shown. In this example, the source and drain regions 44 and 46 are heavily doped n-type doped portions of the epitaxial layer 24. The heavily doped n-type source region 44 is disposed within, on, or otherwise above the body region 48. The heavily n-type doped drain region 46 is spaced from the body region 48 along the lateral dimension shown in FIG. 1. Such spacing defines a conduction path of the device between the source and drain regions 44 and 46. The regions 44, 46, or a portion thereof, may have a dopant concentration at a level sufficient to establish ohmic contacts for biasing the source region 44 and the drain region 46. In this n-channel LDMOS configuration, the drain region 46 is biased at a relatively high drain-source voltage, Vds, relative to the source region 44.

The NLDMOS device 120 includes one or more gate structures 54 formed on or above a surface 56 of the semiconductor substrate 22. In this example, NLDMOS device 120 includes a field plate structure 58 over the drift region 50 for depletion thereof. The gate structure 54 is disposed between the source region 44 and the drain region 46. The gate structure 54 and the field plate structure 58 may be electrically connected to one another. In some embodiments, the gate structure 54 surrounds the drain region 46, which may be centrally or internally disposed within the core device area 42. Alternatively, the gate structure 54 may be arranged in a dual gate finger configuration in which two transistors are symmetrically arranged to share the same drain region 46. The gate structure 54 includes a polysilicon or other conductive plate located on or above a gate dielectric. For example, the gate dielectric may include silicon dioxide (or oxide) deposited or otherwise formed on the surface 56. The gate structure 54 may include one or more dielectric sidewall spacers 60 disposed along lateral edges of the gate structure 54. The sidewall spacers 60 may cover the lateral edges to act as a silicide blocker to prevent a silicide short along the surface of the substrate 22. In the example of FIG. 1, a dielectric structure 62 is disposed between the gate structure 54 and the field plate 58. The sidewall spacers 60 may provide spacing to separate the conductive components of the gate structure 54 from the source region 44 and other regions of the core device area 42. In this example, one of the sidewall spacers 60 is used for alignment purposes in defining an edge of the source region 44.

The configuration of the gate structure 54 may vary. The configuration of the gate structure 54 may include multiple conductive layers (e.g., polysilicon plates). The components, materials, and other characteristics of the gate structure 54 may vary from the example shown.

A number of shallow trench isolation (STI) regions 64 and 65 may be formed at the surface 56 in the semiconductor substrate 22. In this embodiment, the STI region 64 is disposed between the gate structure 54 and the drain region 46 to protect the gate structure 54 from the high voltage applied to the drain region 46. For example, the STI region 64 may be configured to prevent or minimize hot carrier injection (HCI) into the oxide layer of the gate structure 54. The STI region 64 is disposed in the drift region 50 to form a field drift structure. The other STI region 65 defines active areas along the periphery of the core device area 42. The STI region 65 is disposed between the body contact region 52 and the edge or periphery of core device area 42. In some embodiments, the STI region 65 is disposed between the body contact region 52 and an isolation contact region outside of the core device area 42, as further discussed below in connection with FIG. 5.

Additional, fewer, or alternative STI regions may be disposed in the semiconductor substrate 22 to isolate or separate various contact regions, as well as other regions within the active device area 42 of LDMOS device 120. For example, the body contact region 52 and the source region 44 may be laterally separated by an additional STI region. The surface 56 may be covered by one or more passivation layers 92, including over structures 64, 65, 54, 58, 62, and 60. Any one or more dielectric materials may be used for the passivation layer(s) 92.

The conduction path of the NLDMOS device 120 may be configured with one or more heavily or intermediately doped transition regions 70 (e.g., n-type lightly doped drain, or NLDD, regions) at or near the source and drain regions 44 and 46. Each transition region 70 may be or include a diffused region formed in connection with the source region 44. Such transition regions may couple the source region 44 to a channel region 72 (described below). In this example, the NLDMOS device 120 includes an NLDD region 70 adjacent to the source region 44. The NLDD region 70 may extend laterally under the gate structure 54 as shown.

When the gate structure 54 is biased, charge carriers (in this case, electrons; alternatively, holes) accumulate in one or more channel areas or regions 72. Each channel region 72 (or a portion thereof) may be formed in the body region 48 under the gate structure 54. In this example, the accumulation of electrons results in a charge inversion in the channel region 72 from the p-type of the body region 48 to an n-type conduction layer or area near the surface 56 of the semiconductor substrate 22. Once a sufficient amount of the charge carriers accumulate in the conduction layer or area, charge carriers are capable of flowing from the source region 44 toward the drain region 46 through the channel region 72.

The channel region 72 may include other regions or areas in the semiconductor substrate 22 in which charge inversion or accumulation occurs as a result of the bias applied to the gate structure 54. Charge carriers may also accumulate outside of or beyond the body region 48. For example, charge carriers may accumulate in a region of the epitaxial layer 24 between the body region 48 and the drift region 50, as well as in an accumulation region or portion of the drift region 50 near the surface 56 under the gate structure 54.

After exiting the channel region 72, the charge carriers drift through the drift region 50 to reach the drain region 46. The drift region 50 electrically couples the drain region 46 and the channel region 72. The drift region 50 may be configured to allow the charge carriers to drift under the electric field established by the drain-source voltage applied between the drain region 46 and the source region 44. In this example, the drift region 50 is an n-type well that laterally extends under the STI region 64 as a field drift region.

The drift region 50 may be configured to be depleted to reduce the magnitude of the electric field in areas in or around the drift region 50, or both in and around the drift region 50, via the reduced surface field (RESURF) effect to increase the voltage at which breakdown occurs along the conduction path of NLDMOS device 120. In this example, the drift region 50 is depleted both laterally and vertically. A junction forms between the n-type well of the drift region 50 and the p-type epitaxial layer 24, the body region 48, or both to establish a lateral RESURF effect. The junction is reverse-biased as a result of the application of a drain voltage Vds between the source region 44 and the drain region 46. The drift region 50 is also depleted vertically by a p-type buried well region 74 disposed under the drain region 46.

Further depletion in and around the drift region 50 may be achieved via a double RESURF arrangement in which a voltage is applied to buried isolation layers 30 and 100 to reverse bias a junction along the buried well region 74, such as by tying drain region 46 to an isolation contact region disposed in the semiconductor substrate 22 outside of the core device area 42. A voltage may also be applied during operation to the buried isolation layers 30 and 100 via the other regions of the doped isolation barrier, in this case, the stacked isolation wells 32, 34. The drain-source bias voltage may thus be used to bias buried isolation layers 30 and 100.

However, the buried isolation layers and other components of the doped isolation barrier are biased at a voltage level lower than the drain-source bias voltage (e.g., the voltage applied to the isolation contact region). The full drain-source bias voltage is not directly applied to the doped isolation barrier. Instead, the potential of the doped isolation barrier is instead partially lifted to the voltage level of the drain-source bias voltage to lower the voltage stress between the body region 48 and the doped isolation barrier (e.g., the buried isolation layers 30 and 100). To further lower the voltage stress between body region 48 and the doped isolation barrier, the lightly-doped buried isolation layer 100 is positioned under body region 48 and in contact with the surrounding doped buried isolation layer 30. The lightly-doped buried isolation layer 100 has a lower dopant concentration compared with the doped buried isolation layer 30. The doped buried isolation layer 30 and the lightly-doped buried isolation layer 100 are not fully depleted under the electric field when the doped isolation barrier is partially lifted. As such, the lightly-doped buried isolation layer 100 extends the vertical stress capability between the body region 48 and the doped isolation barrier. Such partial biasing of the doped isolation barrier is provided by a depleted well region disposed in the semiconductor substrate 22 outside of the core device area 42. An example structure to achieve such biasing is further discussed below in connection with FIG. 6.

FIG. 6 illustrates a schematic cross-sectional view of an example of a semiconductor device 600 that includes an NLDMOS device 620, such as any one of the embodiments discussed above in connection with FIG. 1-5. As an example, NLDMOS device 620 includes a structure similar to that shown in FIG. 1, with upper surface 110 of lightly-doped buried isolation layer 100 coplanar with upper surface 108 of doped buried isolation layer 30, and lower surface 102 of lightly-doped buried isolation layer 100 positioned below lower surface 104 of doped buried isolation layer 30.

An overall device area 28 of the semiconductor device 600 implemented in a semiconductor substrate 22, where only one side or half of the device area 28 is shown in FIG. 6. For example, the device area 28 may be laterally symmetrical about, e.g., a drain region (such as drain region 46), and, thus include a portion that mirrors the portion shown. The overall device area 28 may be defined by one or more doped device isolating layers or other regions in the semiconductor substrate 22 (e.g., the epitaxial layer 24). The regions may be doped semiconductor regions, undoped (e.g., dielectric) regions, or both. In this example, the overall device area 28 is defined by a deep-trench isolation (DTI) ring 29. The structures in the device area 28, such as NLDMOS device 620, are laterally isolated from a remainder of the substrate 22 by the deep-trench isolation (DTI) ring 29 that surrounds the device area 28.

As discussed above, a doped isolation barrier is provided for isolation of NLDMOS device 620 that is located within the overall device area 28. The doped isolation barrier includes one or more regions or layers, which may form an isolation tub in which the active components of the NLDMOS device 620 are disposed.

One or more of the regions and layers that form the doped isolation barrier may be replicated along the DTI ring 29 to form a doped edge isolation barrier that lowers the potential of the doped isolation barrier along the DTI ring 29. In the embodiment shown, regions 36, 37, and 38 are formed along an interior edge of the DTI ring 29. The regions 36, 37 may be formed with, and configured similarly to, the isolation wells 32, 34, and the region 38 may be formed with, and configured similarly to, the doped buried isolation layer 30. In some embodiments, the buried isolation layer 30 has a gap 40 that defines an edge of the region 38 at the periphery of overall device area 28. Region 38 may be ring-shaped to laterally surround the overall device area 28. An edge of region 38 formed by gap 40 may be aligned to edges of wells 36 and 37, or the edge of region 38 may extend past the edges of well 36 and 37. Similarly, an edge of region 30 formed by gap 40 may be aligned to edges of wells 32 and 34, or may extend past the edges of well 32 and 34. Such an embodiment is shown in FIG. 7.

A number of shallow trench isolation (STI) regions, including STI region 66, may be formed at the surface 56 in the semiconductor substrate 22. In the embodiment shown, the STI region 65 is disposed between the body contact region 52 and an isolation contact region 68 outside of the core device area 42. Another STI region 66 is disposed between the isolation contact region 68 and the DTI ring 29, along the periphery of the overall device area 28. Additional, fewer, or alternative STI regions may be disposed in the semiconductor substrate 22 to isolate or separate various contact regions, as well as other regions within the overall device area 28 of the semiconductor device 600.

As noted above in connection with FIG. 1, depletion in and around the drift region 50 may be achieved via a RESURF arrangement in which a voltage is applied to reverse bias a junction along the drift region 50 and the epitaxial layer 24, the drift region 50 and the body region 48, or both. To that end, the semiconductor device 600 includes an interconnect 76 (e.g., a patterned metal interconnect or metal lines) supported by the substrate 22 to electrically tie the drain region 46 to the isolation contact region 68. Further depletion may be achieved via a double RESURF arrangement in which a voltage is applied to the isolation wells 32, 34, which contact buried isolation layers 30 and 100 to reverse bias a junction along the buried well region 74. The drain-source bias voltage may be used to partially bias buried isolation layers 30 and 100, in the partial lifting manner discussed above in connection with FIG. 1.

Such partial biasing of the doped isolation barrier (e.g., buried isolation layers 30 and 100) is provided by a depleted well region 78 disposed in the semiconductor substrate 22 outside of the core device area 42, which is formed about regions 82 and 84, as discussed below. The depleted well region 78 electrically couples the isolation contact region 68 and the doped isolation barrier, which includes the vertical isolation barrier (e.g., wells 32, 34) that is electrically connected to the lateral isolation barrier (e.g., layers 30, 100). A portion of the drain-source bias voltage is supported by the depleted well region 78, such that only part of the bias voltage reaches the doped isolation barrier. The doped isolation barrier may thus be biased at a voltage level lower than the voltage applied to the isolation contact region 68. In this example, the depleted well region 78 is an n-type well that extends between, and is in contact with, the isolation contact region 68 and the isolation well 32. In other embodiments, the depleted well region 78 may be laterally adjacent to additional and/or alternative regions or layers of the doped isolation barrier. As described below, the regions 82 and 84 that form depleted well region 78 may themselves be formed in conjunction with the drift region 50, thereby using a pre-existing implant(s).

The extent of the voltage drop across the depleted well region 78 may vary in accordance with the extent to which the depleted well region 78 is depleted of charge carriers. The depleted well region 78 may be partially or fully depleted of charge carriers. The extent to which the depleted well region 78 is depleted of charge carriers may be enhanced by one or more structures or other characteristics of the periphery of the device area 28. The extent of the depletion may be enhanced both laterally, vertically, or both, examples of which are described below.

In the embodiment shown, the lateral depletion of the depleted well region 78 is enhanced through one or more gaps in the dopant implantation area for the depleted well region 78. The lateral extent of the depleted well region 78 is shown both before and after thermal diffusion (e.g., one or more post-implant dopant drives). Before thermal diffusion, the depleted well region 78 may have an interior gap 80 between regions 82 and 84. Thermal diffusion of the dopant of the depleted well region 78 may then fill in the gap 80, thereby lowering the dopant concentration level within an interior section or portion of the depleted well region 78. As a result, the depleted well region 78 may include an interior section that corresponds with the location of the gap 80 that has a lower dopant concentration level than the exterior sections 82, 84 respectively adjacent the isolation contact region 68 and the isolation well 32 of the doped isolation barrier. The lower dopant concentration level allows the interior section to be more easily depleted of charge carriers, despite being farther away from a reverse-biased junction. As a result, a greater amount or degree of depletion of the depleted well region 78 may thus be achieved.

The location of the gap 80 may vary. However, the interior location of the gap 80 in this example may be useful in connection with possible mask misalignment. The interior gap allows the masks for the implantation and the formation of the STI region 65 to be misaligned, and still provide the full effect of the gap 80.

Further lateral depletion is provided at the outer edge of the depleted well region 78. The depleted well region 78 does not extend across the full lateral extent of the isolation contact region 68. The depleted well region 78 laterally overlaps the isolation contact region 68 to establish the electrical coupling. However, in this example, a gap 86 is provided to allow the p-type epitaxial layer 24 to deplete the depleted well region 78 along the outer side thereof.

Depletion is accomplished in the vertical direction in this embodiment through the presence of a p-type buried well region 88. The buried well region 88 is disposed under and in contact with the depleted well region 78, formed by exterior sections 182, 184 located below exterior sections 82, 84, and similarly separated by interior gap 80. The depleted well region 78 may be thus be depleted from below in a manner similar to the way in which the drift region 50 is depleted by the buried well region 74. The sections 182, 184 of buried well region 88 may be formed in conjunction with the buried well region 74, thereby using a pre-existing implant(s).

Depletion in the vertical direction is also attained via a conductive flap 90 supported by the substrate 22 and positioned over the depleted well region 78. The conductive flap 90 is biased during operation to deplete the depleted well region 78. In this n-channel example, the conductive flap 90 may be grounded or otherwise biased at a low voltage level relative to the drain-source bias voltage. As a result, the charge carriers (in this case, electrons) are pushed away from the surface 56 of the substrate 22, thereby depleting the depleted well region 78 from above. The conductive flap 90 may include a polysilicon plate, one or more metal layers, another conductive structure, or a combination thereof. The conductive flap 90 may be spaced from the surface 56 of the substrate 22 by one or more passivation layers 92. Any one or more dielectric materials may be used for the passivation layer(s) 92.

The formation of the above-described regions involved in the partial biasing of the doped isolation barrier may not increase the complexity or cost of fabricating the semiconductor device 600. For instance, and as described below in connection with the exemplary fabrication process shown in FIG. 8, the same implants (and corresponding mask layers) may be used to form the peripheral regions involved in the partial biasing. The same implant may be used to form the depleted well region 78 and the drift region 50. The depleted well region 78 may thus have a dopant concentration profile in common with the drift region 50. The same implant may be used to form the buried well region 88 and the buried well region 74. The buried well regions 74, 88 may thus have a common dopant concentration profile. Furthermore, in the embodiment shown, the n-type and p-type implants used to form these regions may be configured with the same mask, insofar as the layout of the n-type and p-type regions may be the same.

The partial biasing technique may also be used in connection with the edge regions disposed along the periphery of the overall device area 28 to protect the DTI region 29. In this example, the edge regions are the isolation wells 36, 37 and the buried layer 38. These edge regions are disposed along the inner edge of the ring-shaped DTI region 29 to act as a doped edge isolation barrier that protects against breakdown across the DTI region 29. The partial biasing of these edge regions may be used to avoid the high voltage stress that would otherwise occur if the edge regions were biased at the full drain-source bias voltage. To that end, the semiconductor device 600 includes a depleted edge well region 98 disposed in the semiconductor substrate 22 outside of the core device area 42. The depleted edge well region 98 and the depleted well region 78 may be configured similarly (e.g., configured exactly, including sections 82, 84 and interior gap 80). The depleted edge well region 98 electrically couples the isolation contact region 68 and the regions of the doped edge isolation barrier (e.g., regions 36, 37, and 38). As a result, the doped edge isolation barrier is biased at a lower voltage level than the voltage applied to the isolation contact region 68.

The partial biasing of the edge regions along the DTI region 29 may be greater, less than, or equal to the partial biasing of the doped isolation barrier. In the embodiment shown, the depleted well region 78 and the depleted edge well region 98 are laterally symmetrical about the isolation contact region 68. The same extent of depletion of the depleted edge well region 98 may thus be attained laterally via the same gaps (as described above) and vertically through a buried edge well region 94 and a further conductive flap 96. The buried edge well region 94 and the buried well region 88 may be configured similarly (e.g., configured exactly, including sections 182, 184 and interior gap 80). The edge regions of the doped edge isolation barrier (e.g., regions 36, 37, 38) may thus be biased at the same level as the sidewall regions of the other doped isolation barrier (e.g., regions 32, 34, 30). In other cases, the partial biasing may differ if, for instance, the depleted well regions are not symmetrical (e.g., one may be wider than the other) and/or further depletion is not attained via, for instance, a conductive flap. The voltage level of the doped isolation barriers may thus be adjusted independently of one another.

The partial biasing of the doped isolation barriers may also be supported by the absence of the buried isolation layer 30 (or layer 38) under the depleted well regions 78, 98. In the embodiment shown, the gap 40 in the buried isolation layer 30 is positioned such that the buried isolation layer 30 does not extend under the depleted well regions 78, 98 outside of the core device area 42. It is noted that the biasing of the buried isolation layer 30 occurs via the lateral path involving the depleted well region 78 and the vertical path involving stacked isolation wells 32 and 34, even if the doped isolation barriers (e.g., buried isolation layer 30 or 38) are present under the depleted well regions 78, 98.

FIG. 7 illustrates a schematic cross-sectional view of an example of a semiconductor device 700 that includes a p-channel LDMOS (or PLDMOS) device 720 having partially biased isolation in accordance with one embodiment. The PLDMOS device 700 is configured similarly in many respects to the n-channel examples described above in connection with FIG. 6. Unless noted otherwise, the structures, components, and other elements of the device 700 may be configured as described above in connection with FIG. 6. However, the differences between the devices of FIGS. 6 and 7 may not involve merely switching the conductivity type of each region in the device. For p-type MOS, the breakdown voltage is usually determined by the vertical junction between the drain region 124 and the underlying isolation barrier. In order to improve the breakdown voltage, the lightly-doped buried isolation layer 100 is disposed in the semiconductor substrate 22 underneath the drain contact or region 124. In the embodiment shown in FIG. 7, doped buried isolation layer 30 surrounds a periphery of the core device area 42 and extends across the entire lateral extent of the core device area 42, with the exception of an opening 106 positioned under the drain region 124.

The lightly-doped buried isolation layer 100 is disposed in the semiconductor substrate 22 at least within the opening 106 and is in contact with the doped buried isolation layer 30 to electrically connect the layers 100 and 30.

In some embodiments, the lateral perimeter of opening 106 is large enough to surround a lateral extent of the drain region 124 of a PLDMOS device. In other embodiments, the perimeter of opening 106 is large enough to surround an entire lateral extent of the core device area 42 as similarly shown in FIG. 5, leaving the doped buried isolation layer 30 to surround (and be in electrical contact with) the periphery or peripheral edge of the core device area 42. In still other embodiments, the lightly-doped buried isolation layer 100 is disposed in the semiconductor substrate 22 across the entire lateral extent of the core device area 42, which is surrounded by (and in electrical contact with) a compound isolation layer at the peripheral edge of the core device area 42, where the compound isolation layer includes both the doped buried isolation layer 30 and the lightly-doped buried isolation layer 100 (e.g., layer 30 of FIG. 1-7 would indicate regions in which both the buried layers 30 and 100 are formed, in such embodiments). Additionally, an upper surface 110 and a lower surface 102 of the lightly-doped buried isolation layer 100 may be coplanar or otherwise positioned in relation to the upper surface 108 and lower surface 104 of the doped buried isolation layer 30, as described above in connection with FIG. 1-6.

A number of differences also arise from the use of a p-type substrate for the device 700. Indeed, in the example of FIG. 7, the device 700 is formed in the same p-type substrate 22 in which the device 600 is formed. The device 700 may present other differences not related to partial biasing, such as the configuration of a gate structure. A split gate configuration like that discussed above in the NLDMOS configuration could also be used in the PLDMOS configuration. To ensure depletion of the depleted well regions, a field plate structure like that discussed above in the NLDMOS configuration may also be included in the PLDMOS configuration.

The use of the p-type substrate 22 also leads to a number of other aspects in common with the device 600 of FIG. 6. For instance, the isolation-related elements of the devices 600 and 700 may be configured similarly, each of which is accordingly referenced with the same numeral used above. For example, the device 700 may include a DTI structure 29 that defines an overall device area 28, a doped isolation barrier that includes a doped buried isolation layer 30, lightly-doped buried isolation layer 100, and isolation wells 32, 34, and a number of edge regions along the DTI structure 29, such as edge regions 36, 37, 38. Each of the doped regions may be n-type regions as described above.

The elements of the device 700 directed to partial biasing of the doped isolation barrier of the device 700 may also be configured as described above, including the conductivity type. Thus, the device 700 includes an isolation contact region 68, and depleted well region 78, depleted edge well region 98, buried well regions 88, 94, and conductive flaps 90, 96. The conductivity types, dopant concentration profiles, implantation, and other characteristics of these regions directed to partially biased isolation may be as described above. As a result, the depleted well region 78 and the depleted edge well region 98 allow the regions of the doped isolation barriers of the device 700 to be biased at a voltage level lower than the voltage applied to the isolation contact region 68, as described above.

The differences presented by the semiconductor device 700 involve the elements disposed in a core device area 42 of PLDMOS device 720. In the p-channel example of FIG. 7, the voltage applied to the isolation contact region 68 is the bias voltage applied to a source region 126 and a body region 120, rather than to a drain region 124. An interconnect 112 (e.g., a patterned metal interconnect or metal lines) is used to electrically tie the isolation contact region 68 to the source region 126 and, via a body contact region 122, the body region 120. The partial lifting effected by the depleted well regions 78, 98 thus allow the regions of the doped isolation barriers to be electrically tied to the body region 120, rather than to a drift region 118. In this case, the source and drain regions 126, 124 are heavily doped p-type regions, while the body contact region 122 is a heavily doped n-type region. The source region 126 is disposed in an n-type well of the body region 120. As a result, the body region 120 and the regions and layers of the doped isolation barrier have a common conductivity type, in this example. The drain region 124 is disposed in a p-type well of the drift region 118.

To allow the depleted well regions 78, 98 to partially bias the doped isolation barrier, the body region 120 is electrically isolated from the regions and layers of the doped isolation barrier within the core device area 42. To that end, PLDMOS device 720 includes a number of buried well regions 114, 116 disposed in the semiconductor substrate 22 within the core device area 42. The buried well regions 114, 116 are oppositely doped (e.g., p-type) regions arranged to collectively surround the body region 120. The buried well region 114 is laterally adjacent to the body region 120, and disposed between the body region 120 and the isolation wells 32, 34, to electrically isolate the body region 120 in a lateral direction. The buried well region 116 is disposed under the body region 120 between the body region 120 and the lateral isolation barrier (e.g., the lightly-doped buried isolation layer 100 and the doped buried isolation layer 30) to electrically isolate the body region 120 in a vertical direction. Each of the buried well regions 114, 116 may be in contact with the body region 120 as shown in FIG. 7. Alternatively, the buried well regions 114 may be adjacent to, but spaced from, the body region 120, such that the p-type doping of the epitaxial layer 24 is disposed therebetween.

In the embodiment of FIG. 7, the depleted well regions 78, 98 and the body region 120 may have a common dopant concentration profile. The n-type implant used to form the body region 120 may also be used to form the depleted well regions 78, 98. Similarly, the p-type implant used to form the buried well region 116 may also be used to form the buried well regions 88, 94. The buried well regions 88, 94, and 116 may thus have a common dopant concentration profile. In this way, and as described above in connection with FIG. 6, additional implants or masks need not be added to the fabrication process to form the regions involved in the partial biasing of the doped isolation barrier. Also as described above in connection with FIG. 6, the same mask may be used to configure both of these n-type and p-type implants. As a result, the partial biasing of the doped isolation barrier may be achieved in a cost-effective manner.

The formation of the buried well region 114 may also rely on a pre-existing implant procedure. In this example, the implant used to form the drift region 118 may also form the buried well region 114. The drift region 118 and the buried well region 114 may thus have a common dopant concentration profile in such p-channel LDMOS devices.

The above-described devices are shown in simplified form. For example, while FIG. 1-7 may schematically depict an Ohmic metal layer and metal-one layer used to form various electrodes, FIG. 1-7 do not show a number of other metal layers configured for interconnections with the electrodes. The devices may have a number of other structures or components for connectivity, isolation, passivation, and other purposes not shown in FIG. 1-7 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 6, the above-referenced semiconductor regions may have the following approximate concentrations and thicknesses:

|  | Concentration | Thickness |
| --- | --- | --- |
| p-epi 24: | $1 \times 10^{13}$-$5 \times 10^{15}$/cm3 | 3-10 μm |
| substrate 26: | $1 \times 10^{14}$-$1 \times 10^{19}$/cm3 | not applicable |
| buried layer 30: | $1 \times 10^{15}$-$1 \times 10^{20}$/cm3 | 0.5-5.0 μm |
| buried layer 100: | $1 \times 10^{13}$-$1 \times 10^{18}$/cm3 | 0.5-5.0 μm |
| wells 32, 36: | $1 \times 10^{15}$-$1 \times 10^{19}$/cm3 | 0.5-5.0 μm |
| wells 34, 37: | $1 \times 10^{15}$-$1 \times 10^{19}$/cm3 | 0.5-5.0 μm |
| body 48: | $1 \times 10^{15}$-$1 \times 10^{19}$/cm3 | 0.2-5.0 μm |
| source 44: | $1 \times 10^{20}$-$1 \times 10^{23}$/cm3 | 0.05-0.5 μm |
| drain 46: | $1 \times 10^{20}$-$1 \times 10^{23}$/cm3 | 0.05-0.5 μm |
| drift 50, 78: | $1 \times 10^{15}$-$5 \times 10^{18}$/cm3 | 0.2-5.0 μm |
| iso contact 68: | $1 \times 10^{20}$-$1 \times 10^{23}$/cm3 | 0.05-0.5 μm |
| NLDD 70: | $1 \times 10^{17}$-$1 \times 10^{21}$/cm3 | 0.05-0.5 μm |
| buried 74, 88: | $1 \times 10^{15}$-$5 \times 10^{18}$/cm3 | 0.2-5.0 μm |

The concentrations and thicknesses may be different in other embodiments. For example, the dopant concentration of the bulk substrate 26 may vary considerably.

Figure 8:
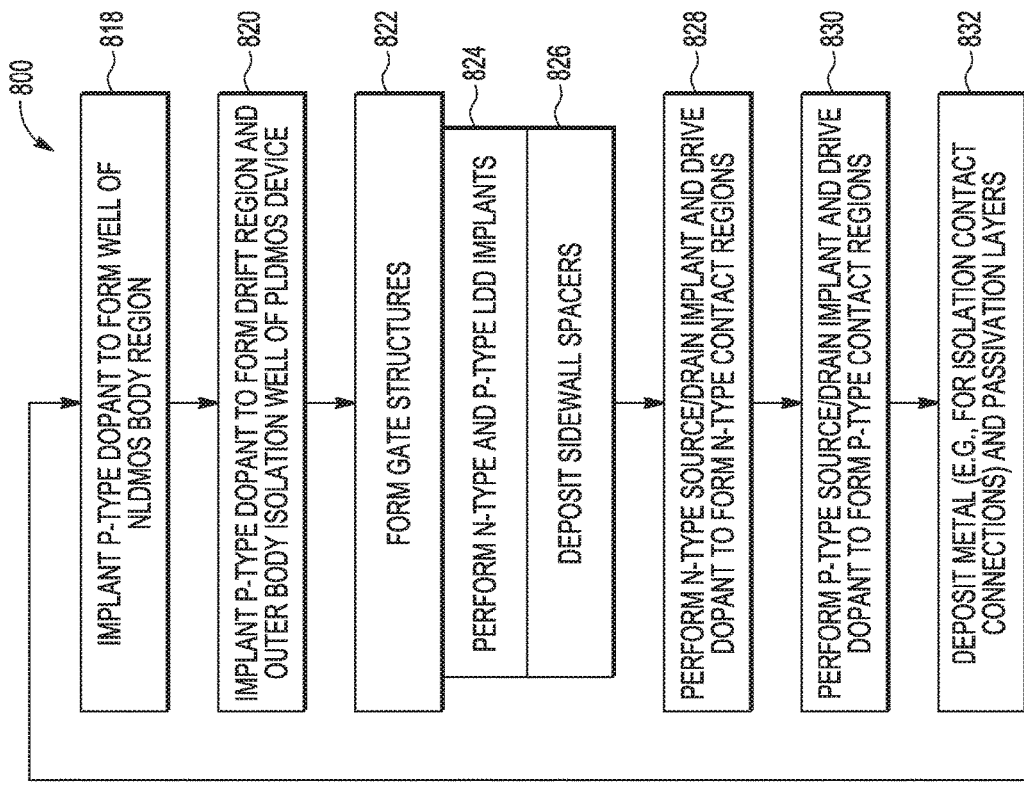
FIG. 8 illustrates a flowchart depicting an example process for fabricating an example semiconductor device that includes either an NLDMOS or PLDMOS device in which the present disclosure is implemented, according to some embodiments.
Figure 8:
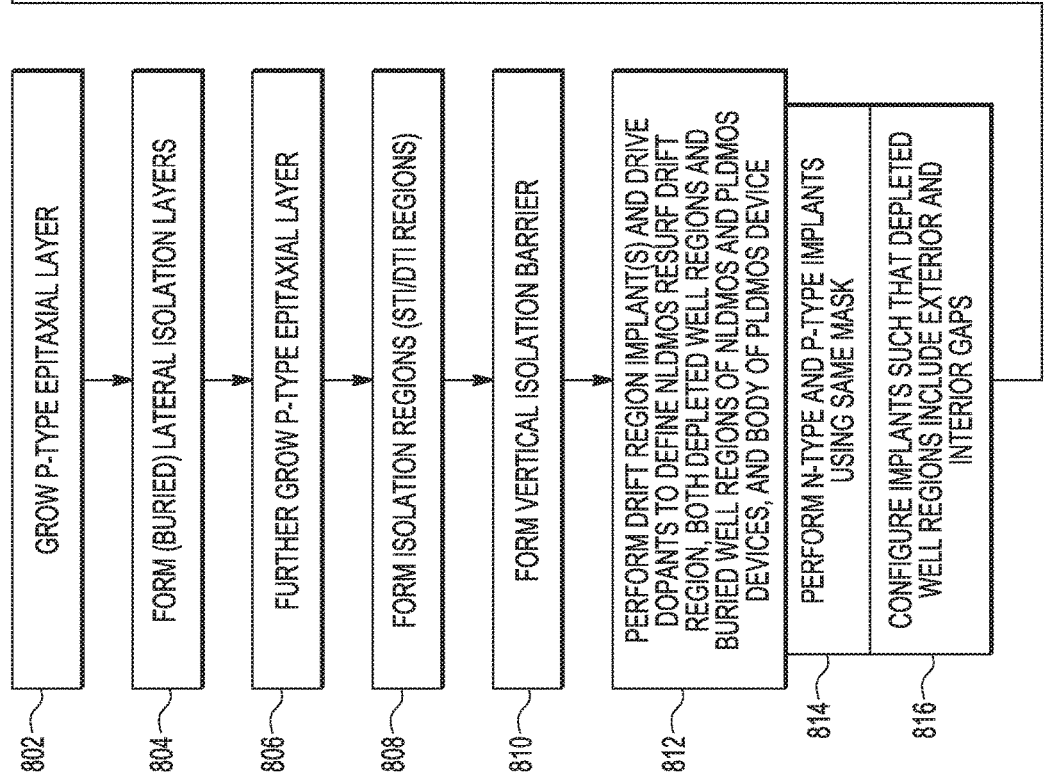

FIG. 8 illustrates a flowchart depicting an example process or method 800 for fabricating an example semiconductor device that includes an LDMOS device in which the present disclosure is implemented. In the embodiment shown, the method 800 is configured to fabricate both an n-channel device and a p-channel device. One or both of the devices may be LDMOS devices having a RESURF configuration and one or more of the above-described features directed to partially biasing a doped isolation barrier. The devices are fabricated with a p-type bulk semiconductor substrate, the regions or layers of which may have the conductivity types of the n-channel and p-channel examples described above, or be alternatively fabricated with an n-type substrate.

The method includes a sequence of acts, only the salient of which are depicted for convenience in illustration. The ordering of the acts may vary in other embodiments. For example, an act directed to forming isolation wells may be implemented after one or more acts configured to form well regions that are depleted to support partial biasing of a doped isolation barrier.

The method 800 may optionally begin with one or more acts directed to the growth or other formation of one or more epitaxial layers (e.g., layer 24) on a semiconductor substrate (e.g., bulk substrate 26). For example, a p-type epitaxial layer is grown on a p-type bulk substrate in an act 802. In some cases, e.g., where the p-type bulk substrate is lightly doped, the act 802 may be omitted, e.g., in the interest of reducing process costs.

During or after the formation of the epitaxial layer, a lateral isolation barrier is formed in the substrate in an act 804. The lateral isolation barrier is part of a doped isolation barrier that, in some embodiments, is shaped as an isolation tub. The lateral extent of the lateral isolation barrier defines a core device area of the device being fabricated by method

800. The act 804 may include a dopant implantation procedure or other doping technique. The lateral isolation barrier is formed by forming a doped isolation layer (e.g., layer 30) having an opening (e.g., a dopant used to form the doped isolation layer is absent or is not present within the opening), and forming a lightly-doped isolation layer (e.g., layer 100) at least within the opening. In some embodiments, the doped isolation layer having the opening may be formed first, where the lightly doped isolation layer is formed at least within the opening. In other embodiments, the lightly-doped isolation layer is formed in an area in which the opening is intended to be positioned (e.g., below an area in which a body region will be formed in an NLDMOS, below an area in which a drain region will be formed in a PLDMOS, or laterally across the entire core device area), and the doped isolation layer having an opening is then formed around the lightly-doped isolation layer.

The implantation procedure of act 804 may also form an edge isolation well (e.g., regions 38) in a periphery of an overall device area along which a DTI structure may be formed. To this end, the doped isolation layer may also be configured with a gap (e.g., gap 40) outside of the core device area to form the edge isolation well, as described above.

A photolithographic or other patterning procedure may be utilized in connection with the formation of the doped isolation layer and the lightly-doped isolation layer, in order to dispose the lateral isolation barrier in the substrate under the core device area and to dispose a portion of the doped isolation layer at the periphery of the overall device area. In some embodiments, the lateral isolation barrier is formed before the growth of an epitaxial layer (e.g., layer 24).

In act 806, a p-type epitaxial layer (e.g., layer 24) is grown or further grown. As a result, the lateral isolation barrier and edge isolation well becomes a buried lateral isolation barrier.

The method 800 then continues to act 808, where a number of STI regions and DTI structures are formed in the substrate. The STI regions (e.g., regions 64, 65, 66) may be used to define and separate active areas within and outside of the core device area. One or more STI regions may also be used to space a drain region from a gate structure in a field drift arrangement, as described above. The DTI structures (e.g., region 29) may be ring-shaped to define an overall device area for each device. In other embodiments, the act 808 may be implemented after implementation of one or more the implant procedures described below.

The STI regions and DTI structures may be formed via any now known or hereafter developed procedure. In some cases, the act 808 may include the formation of a trench and the deposition (e.g., chemical vapor deposition, or CVD) of one or more dielectric materials in the trench. For example, the STI trenches may be filled with dielectric materials, while the DTI trenches may be filled with dielectric material on the edge and heavily doped polysilicon in the center. Additional or alternative materials may be deposited in some embodiments, such as filling the trench with silicon oxide.

In an act 810, an implantation procedure is performed to form a vertical isolation barrier of the doped isolation barrier. In some embodiments, the doped isolation barrier is shaped as an isolation tub, where the vertical isolation barrier extends upward from the buried lateral isolation barrier to form a sidewall of the isolation tub. The implantation may be configured to form one or more isolation wells (e.g., regions 32, 34), which may be vertically stacked upon one another to define the sidewall. The vertical isolation barrier of the doped isolation barrier defines the lateral boundary of the core device area. The implantation procedure of act 810 may also form edge isolation wells (e.g., regions 36, 37) along the DTI structure, as described above. The act 810 may be performed at various points in the fabrication method 800.

One or more dopant implantation procedures are performed in an act 812 to form a number of well regions for an n-channel or p-channel device. Each implantation procedure may be configured to form multiple well regions. The multiple well regions of each implantation procedure are configured and positioned for different purposes, despite having a common dopant concentration profile, as described above.

An n-type implantation of the act 812 is configured to form a drift region (e.g., region 50) of the n-channel device or a body region (e.g., region 120) of the p-channel device, as well as one or more depleted well regions (e.g., regions 78, 98) of both the n-channel and p-channel devices. The depleted well regions are disposed outside of the core device area. The depleted well region(s) electrically couple the isolation contact region and the vertical isolation barrier to support the partial biasing of the lateral isolation barrier, as described above.

A p-type implantation of the act 812 may be directed to forming the buried well regions (e.g., regions 94, 88) used to deplete the depleted well regions, as well as a RESURF region (e.g., region 74) of the n-channel device used to deplete the drift region, and a buried well region (e.g., 116) used to isolate the body region of the p-channel device within the core device area.

In some cases, the n-type and p-type implantation procedures of the act 812 use the same mask, as noted in act 814. The n-type and p-type implantations of the act 812 may also include configuring the implantations in an act 816 such that the depleted well regions (and the buried well regions in contact therewith) have exterior and interior gaps (e.g., gaps 80, 86), as described above. The exterior gap may be under an isolation contact region, while the interior gaps are positioned to define an interior portion of the depleted well regions with a lower dopant concentration level for easier depletion. With the exterior gaps, the implantations are configured such that the depleted well regions and corresponding buried well regions do not extend across an entire lateral extent of the isolation contact region. With the interior gaps, the n-type and p-type implantation procedures of the act 812 may be configured to provide dopant throughout a well area of the well regions except an interior portion of the well area. The act 812 may then include driving the dopant of the third implantation procedure via thermal diffusion into the interior portion such that the well regions have a lower interior dopant concentration level for depletion of the well regions.

A separate p-type implantation procedure is implemented in an act 818 to form the body region (e.g., region 48) of the n-channel device. In an act 820, a p-type implantation procedure is implemented to form a drift region (e.g., 118) of the p-channel device. In some embodiments, the p-type implantation may also be configured to form a buried well region (e.g., region 114) directed to laterally isolating the body region of the p-channel device within the core device area. The order in which these implantation procedures are implemented may vary from the order shown in FIG. 8.

Collectively, the foregoing implantation procedures may be configured such that the body region of the p-channel device is electrically isolated from the doped isolation barrier within the core device area, and such that the doped isolation barrier is biased at a different voltage level than the isolation contact region, as described above.

The fabrication method may then include one or more procedures collectively shown in act 822. The procedures may be implemented in various orders. Additional or alternative procedures may be implemented. One or more components of a gate structure may be initially be formed. For instance, a gate dielectric layer and conductive plate may be deposited and patterned. A number of implants may then be performed in an act 824 to form LDD regions. After the dopant for the LDD regions is implanted, sidewall spacers may then be deposited in an act 826. The sidewall spacers and/or other components of the gate structure may then be used for self-alignment of a source region.

In acts 828 and 830, n-type and p-type source/drain implantations are performed to form the various n-type and p-type contact regions of the devices, respectively. Source and drain regions may thus be formed for both the n-channel and p-channel devices. In examples having n-type isolation regions (e.g., a p-type substrate), the n-type source/drain implantation is also configured to form an isolation contact region outside of the core device area of the n-channel and p-channel devices. The p-type and n-type body contact regions of the n-channel and p-channel devices are also formed.

A number of metal and passivation layers may then be deposited on the substrate in an act 832. The metal layers may be patterned to form Ohmic contacts and electrodes, as well as field plates as described above, and various interconnects, including interconnects to bias the isolation contact regions as described above.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Although described in connection with respective n-channel and p-channel LDMOS transistors, the disclosed devices are not limited to any particular transistor configuration. The partial isolation biasing of the disclosed devices may be useful in a wide variety of power electronic devices. For instance, application of the features of the disclosed devices is not limited to LDMOS or other power MOS devices. The partial isolation biasing is also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel and p-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with the figures may have a conductivity type (e.g., n-type or p-type) opposite to the type identified in the examples below.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The semiconductor devices formed in the semiconductor substrate may use a sequence of numerous process steps applied to semiconductor substrate, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of active circuitry components that may be implemented in the semiconductor devices include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the active circuit components listed above or may be another type of microelectronic device.

By now it should be appreciated that there has been provided embodiments of laterally diffused metal oxide semiconductor (LDMOS) device that implements a configuration of isolation regions to form a lateral isolation barrier that underlies a core device area of the LDMOS device that includes the device body. The lateral isolation barrier includes a doped buried layer having an opening that is disposed underneath the device body, and a lightly-doped buried layer having a lower dopant concentration than the doped buried layer that is disposed at least within the opening and in electrical contact with the doped buried layer.

In one embodiment of the present disclosure, a device is provided, which includes: a semiconductor substrate including an active device area; a body region disposed in the semiconductor substrate within the active device area, wherein a channel is formed within the body region during operation; a doped isolation layer disposed in the semiconductor substrate underneath the active device area, the doped isolation layer including an opening positioned under the active device area; and a lightly-doped isolation layer disposed in the semiconductor substrate underneath the active device area, the lightly-doped isolation layer positioned at least within the opening and in electrical contact with the doped isolation layer, wherein the doped isolation layer and the lightly-doped isolation layer form a doped isolation barrier that extends across an entire lateral extent of the active device area.

One aspect of the above embodiment provides that one or more of an upper surface and a lower surface of the lightly-doped isolation layer being co-planar with a respective upper and lower surface of the doped isolation layer.

Another aspect of the above embodiment provides that one or more of an upper surface and a lower surface of the lightly-doped isolation layer being positioned below a respective upper and lower surface of the doped isolation layer.

Another aspect of the above embodiment provides that a lower surface of the lightly-doped isolation layer being positioned above a lower surface of the doped isolation layer.

Another aspect of the above embodiment provides that the device includes an n-channel laterally diffused metal-oxide-semiconductor (LDMOS) device, and the opening is positioned under the body region of the n-channel LDMOS device within the active device area and has a perimeter that surrounds at least a lateral extent of the body region.

Another aspect of the above embodiment provides that the device includes a p-channel laterally diffused metal-oxide-semiconductor (LDMOS) device, and the opening is positioned under a drain region of the p-channel LDMOS device within the active device area and has a perimeter that surrounds at least a lateral extend of the drain region.

Another aspect of the above embodiment provides that the opening has a perimeter equivalent to a lateral extent of the active device area.

Another aspect of the above embodiment provides that the lightly-doped isolation layer is formed across the entire lateral extent of the active device area, including within regions in which the doped isolation layer is formed.

Another aspect of the above embodiment provides that the doped isolation barrier extends a breakdown voltage of the device up to 250V during operation of the device.

Another aspect of the above embodiment provides that the device includes an n-channel laterally diffused metal-oxide-semiconductor (LDMOS) device, and the body region has a first conductivity type, and the doped isolation layer and the lightly-doped isolation layer have a second conductivity type opposite the first conductivity type.

Another aspect of the above embodiment provides that the device includes a p-channel laterally diffused metal-oxide-semiconductor (LDMOS) device, and the body region has a first conductivity type, and the doped isolation layer and the lightly-doped isolation layer also have the first conductivity type.

Another aspect of the above embodiment provides that the device further includes: a source region disposed at a surface of the semiconductor substrate within the body region, a drain region disposed at a surface of the semiconductor substrate within the active device area and laterally separated from the source region, and an isolation contact region disposed in the semiconductor substrate outside of the active device area and to which a voltage is applied during operation of the device.

A further aspect of the above embodiment provides that the device includes an n-channel laterally diffused metal-oxide-semiconductor (LDMOS) device, and the isolation contact region and the drain region are electrically tied to one another.

Another further aspect of the above embodiment provides that the device includes a p-channel laterally diffused metal-oxide-semiconductor (LDMOS) device, and the isolation contact region and the source region are electrically tied to one another.

In another embodiment of the present disclosure, a device is provided, which includes: a semiconductor substrate including an active device area; a body region disposed in the semiconductor substrate within the active device area; and a doped isolation barrier including a lightly-doped isolation layer disposed in the semiconductor substrate underneath the active device area, the lightly-doped isolation layer extends across an entire lateral extent of the active device area including under the body region.

One aspect of the above embodiment provides that the doped isolation barrier further includes a doped isolation layer disposed in the semiconductor substrate underneath a peripheral edge of the active device area, the doped isolation layer surrounding and in electrical contact with the lightly-doped isolation layer.

Another aspect of the above embodiment provides that the doped isolation barrier further includes a compound doped isolation layer disposed in the semiconductor substrate underneath a peripheral edge of the active device area, the compound doped isolation layer including a doped isolation layer that overlaps an edge portion of the lightly-doped isolation layer.

Another aspect of the above embodiment provides that the device further includes: one or more stacked isolation wells disposed in the semiconductor substrate at a peripheral edge of the active device area, the one or more stacked isolation wells in electrical contact with the doped isolation layer, wherein the one or more stacked isolation wells form a vertical portion of the doped isolation barrier, the vertical portion surrounds the active device area.

Another aspect of the above embodiment provides that the device further includes: an isolation contact region disposed in the semiconductor substrate outside of the active device area and to which a voltage is applied during operation; and a depleted well region disposed in the semiconductor substrate outside of the active device area, wherein the depleted well region electrically couples the isolation contact region and the doped isolation barrier such that the doped isolation barrier is biased at a voltage level lower than the voltage applied to the isolation contact region.

Another aspect of the above embodiment provides that the device includes one of: an n-channel laterally diffused metal-oxide-semiconductor (LDMOS) device, and a p-channel LDMOS device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "approximately" and "about" mean a value close to or within an acceptable range of an indicated value, amount, or quality, which also includes the exact indicated value itself, taking into account any minor imperfections or deviations, if any, that arise from usual and expected process abnormalities that may occur during device fabrication, which are not significant for the stated purpose or value. Also as used herein, the term "opening" or "space" in a material indicates a void or volume in which the material is absent.

Although the invention is described herein with reference to specific embodiments, various modifications and changes can be made without departing from the scope of the present invention as set forth in the claims below. For example, additional or fewer regions may be implemented in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A device comprising:
a semiconductor substrate including an active device area;
a body region disposed in the semiconductor substrate within the active device area, wherein a channel is formed within the body region during operation;
an isolation well disposed in the semiconductor substrate and positioned laterally adjacent to the active device area;
a doped isolation layer disposed in the semiconductor substrate underneath the active device area and separated from the body region, the doped isolation layer in electrical contact with the isolation well, the doped isolation layer having a first dopant concentration level, the doped isolation layer including an opening positioned under the body region, the opening having a perimeter that surrounds a lateral extent of the body region; and
a lightly-doped isolation layer disposed in the semiconductor substrate underneath the active device area and separated from the body region, the lightly-doped isolation layer having a second dopant concentration level less than the first dopant concentration level, the lightly-doped isolation layer positioned at least within the opening and in electrical contact with the doped isolation layer, wherein
the isolation well, the doped isolation layer, and the lightly-doped isolation layer form a doped isolation barrier that extends across an entire lateral extent of the active device area;
an isolation contact region disposed in the semiconductor substrate outside of the active device area and to which a voltage is applied during operation of the device;
a depleted well region disposed in the semiconductor substrate between the isolation contact region and the isolation well,
wherein the depleted well region electrically couples the isolation contact region and the isolation well such that the depleted well region permits only a portion of the voltage applied to the isolation contact region to reach the isolation well, the doped isolation layer, and the lightly-doped isolation layer to lower voltage stress between the body region and the doped isolation barrier during operation of the device.

2. The device of claim 1, wherein
one or more of an upper surface and a lower surface of the lightly-doped isolation layer being co-planar with a respective upper and lower surface of the doped isolation layer.

3. The device of claim 1, wherein
one or more of an upper surface and a lower surface of the lightly-doped isolation layer being positioned below a respective upper and lower surface of the doped isolation layer.

4. The device of claim 1, wherein
a lower surface of the lightly-doped isolation layer being positioned above a lower surface of the doped isolation layer.

5. The device of claim 1, wherein
the lightly-doped isolation layer is formed across the entire lateral extent of the active device area, including within regions in which the doped isolation layer is formed.

6. The device of claim 1, wherein
the doped isolation barrier extends a breakdown voltage of the device up to 250V during operation of the device.

7. The device of claim 1, wherein
the device comprises an n-channel laterally diffused metal-oxide-semiconductor (LDMOS) device, and
the body region has a first conductivity type, and
the isolation well, the doped isolation layer, and the lightly-doped isolation layer have a second conductivity type opposite the first conductivity type.

8. The device of claim 1, wherein
the device comprises a p-channel laterally diffused metal-oxide-semiconductor (LDMOS) device, and
the body region has a first conductivity type, and
the isolation well, the doped isolation layer, and the lightly-doped isolation layer also have the first conductivity type.

9. The device of claim 1, further comprising:
a source region disposed at a surface of the semiconductor substrate within the body region, and
a drain region disposed at a surface of the semiconductor substrate within the active device area and laterally separated from the source region.

10. The device of claim 9, wherein
the device comprises an n-channel laterally diffused metal-oxide-semiconductor (LDMOS) device, and
the isolation contact region and the drain region are electrically tied to one another.

11. The device of claim 9, wherein
the device comprises a p-channel laterally diffused metal-oxide-semiconductor (LDMOS) device, and
the isolation contact region and the source region are electrically tied to one another.

12. The device of claim 1, wherein
the isolation well comprises one or more stacked isolation wells disposed in the semiconductor substrate at a peripheral edge of the active device area and defines the entire lateral extent of the active device area, the one or more stacked isolation wells in electrical contact with the doped isolation layer, wherein the one or more stacked isolation wells form a vertical portion of the doped isolation barrier, the vertical portion surrounds the active device area.

13. The device of claim 1, wherein
the depleted well region includes one or more interior gaps having a lower dopant concentration level than surrounding portions of the depleted well region,
wherein the depleted well region is configured to implement a voltage drop across the depleted well region based on depletion of charge carriers within the depleted well region.

14. The device of claim 9, wherein
the doped isolation barrier is configured to be biased at a voltage level lower than a drain-source bias voltage during operation of the device.

15. The device of claim 1, further comprising:
a drift region disposed in the semiconductor substrate within the active device area and laterally separated from the body region, and
a drain region disposed at a surface of the semiconductor substrate within the drift region, wherein the doped isolation layer extends laterally underneath the drift region.

16. The device of claim 15, further comprising:
a buried well region disposed in the semiconductor substrate within the active device area and underlying the drift region, the buried well region vertically separated from the doped isolation layer, wherein the drift region and the buried well region form a double RESURF (reduced surface field) structure.

17. The device of claim 16, further comprising:
a source region disposed at the surface of the semiconductor substrate within the body region, wherein
the source and drain regions are configured to be reverse biased at a drain-source bias voltage,
a lateral junction between the drift region and the body region is configured to be reverse biased at the drain-source bias voltage, and
a vertical junction between the buried well region and the doped isolation layer is configured to be partially reverse biased at a bias voltage less than the drain-source bias voltage.

18. The device of claim 1, wherein
the lightly-doped isolation layer positioned at least within the opening reduces a magnitude of an electric field near the junction between the body region and the doped isolation barrier.

19. The device of claim 9, wherein
terminals of the device are configured to be level shifted relative to the semiconductor substrate for high voltage operation.

* * * * *